United States Patent
Klipp

(10) Patent No.: US 9,146,471 B2
(45) Date of Patent: Sep. 29, 2015

(54) RESIST STRIPPING COMPOSITIONS AND METHODS FOR MANUFACTURING ELECTRICAL DEVICES

(75) Inventor: Andreas Klipp, Lambsheim (DE)

(73) Assignee: BASF SE, Ludwigshafen (DE)

( * ) Notice: Subject to any disclaimer, the term of this patent is extended or adjusted under 35 U.S.C. 154(b) by 40 days.

(21) Appl. No.: 13/319,187

(22) PCT Filed: Apr. 20, 2010

(86) PCT No.: PCT/EP2010/055205
§ 371 (c)(1),
(2), (4) Date: Nov. 7, 2011

(87) PCT Pub. No.: WO2010/127943
PCT Pub. Date: Nov. 11, 2010

(65) Prior Publication Data
US 2012/0058644 A1 Mar. 8, 2012

Related U.S. Application Data

(60) Provisional application No. 61/176,179, filed on May 7, 2009.

(51) Int. Cl.
| | | |
|---|---|---|
| *G03F 7/42* | (2006.01) | |
| *H01L 21/302* | (2006.01) | |
| *G03F 7/20* | (2006.01) | |
| *H01L 21/02* | (2006.01) | |
| *H01L 21/311* | (2006.01) | |

(52) U.S. Cl.
CPC ........ *G03F 7/425* (2013.01); *G03F 7/20* (2013.01); *H01L 21/02063* (2013.01); *H01L 21/31133* (2013.01)

(58) Field of Classification Search
CPC ..... G03F 7/425; G03F 7/20; H01L 21/31133; H01L 21/02063
USPC ............... 430/311, 313, 314, 317; 510/176
See application file for complete search history.

(56) References Cited

U.S. PATENT DOCUMENTS

| | | | |
|---|---|---|---|
| 6,040,117 A | 3/2000 | Ota et al. | |
| 2004/0106530 A1* | 6/2004 | Daviot et al. | 510/175 |
| 2004/0106532 A1 | 6/2004 | Yokoi et al. | |
| 2004/0256358 A1 | 12/2004 | Shimizu et al. | |
| 2005/0263743 A1 | 12/2005 | Lee | |
| 2005/0266683 A1 | 12/2005 | Lee | |
| 2009/0121353 A1* | 5/2009 | Ramappa et al. | 257/751 |
| 2010/0242998 A1* | 9/2010 | Quillen et al. | 134/19 |
| 2011/0046314 A1 | 2/2011 | Klipp et al. | |
| 2011/0076416 A1 | 3/2011 | Klipp et al. | |

FOREIGN PATENT DOCUMENTS

| | | |
|---|---|---|
| CN | 2008-001693 | * 10/2008 |
| CN | 101398638 A | 4/2009 |
| JP | 2005-031682 | 2/2005 |
| JP | 2005 181802 | 7/2005 |
| WO | 2009 046637 | 4/2009 |
| WO | 2010 127941 | 11/2010 |

OTHER PUBLICATIONS

English translation of CN 2008-001693, Oct. 2008.*
Office Action issued May 8, 2013, in European Patent Application No. 10715225.8.
International Search Report Issued Jul. 12, 2010 in PCT/EP10/055205 Filed Apr. 20, 2010.
U.S. Appl. No. 61/176,165, filed May 7, 2009, Klipp.
U.S. Appl. No. 13/265,647, filed Oct. 21, 2011, Klipp.
U.S. Appl. No. 13/145,257, filed Jul. 22, 2011, Klipp, et al.
U.S. Appl. No. 13/307,497, filed Nov. 30, 2011, Montero Pancera, et al.
U.S. Appl. No. 13/380,071, filed Dec. 22, 2011, Mellies, et al.
U.S. Appl. No. 13/387,787, filed Jan. 30, 2012, Chen et al.
Office Action issued Apr. 22, 2014 in Japanese Patent Application No. 2012-508978.
Office Action issued Aug. 6, 2014 in Russian Patent Application No. 2011149552 (with English language translation).

* cited by examiner

*Primary Examiner* — Brittany Raymond
(74) *Attorney, Agent, or Firm* — Oblon, McClelland, Maier & Neustadt, L.L.P.

(57) ABSTRACT

A liquid composition free from N-alkylpyrrolidones and hydroxyl amine and its derivatives, having a dynamic shear viscosity at 50° C. of from 1 to 10 mPas as measured by rotational viscometry and comprising based on the complete weight of the composition, (A) of from 40 to 99.95% by weight of a polar organic solvent exhibiting in the presence of dissolved tetramethylammonium hydroxide (B) a constant removal rate at 50° C. for a 30 nm thick polymeric barrier anti-reflective layer containing deep UV absorbing chromophoric groups, (B) of from 0.05 to <0.5% of a quaternary ammonium hydroxide, and (C) <5% by weight of water; method for its preparation, a method for manufacturing electrical devices and its use for removing negative-tone and positive-tone photoresists and post etch residues in the manufacture of 3D Stacked Integrated Circuits and 3D Wafer Level Packagings by way of patterning Through Silicon Vias and/or by plating and bumping.

30 Claims, No Drawings

RESIST STRIPPING COMPOSITIONS AND METHODS FOR MANUFACTURING ELECTRICAL DEVICES

CROSS REFERENCE TO RELATED APPLICATION

This application is a 371 of PCT/EP2010/055205, filed on Apr. 20, 2010, and claims priority to U.S. Provisional Patent Application No. 61/176,179, filed on May 7, 2009.

FIELD OF THE INVENTION

The present invention relates to new resist stripping compositions useful for removing patterned resists from substrates, in particular semiconductor substrates, containing copper and low-k or ultra low-k materials.

Moreover, the present invention relates to new methods for manufacturing electrical devices, in particular semiconductor integrated circuits (ICs), liquid crystal panels, organic electroluminescent panels, printed circuit boards, micro machines, DNA chips and micro plants, especially ICs, which new methods make use of the new resist stripping compositions.

DESCRIPTION OF THE PRIOR ART

Resists such as deep UV photo resists or electron beam resists are used in the microlithographic technique for producing a wide range of electrical devices, e.g. semiconductor integrated circuits (ICs), liquid crystal panels, organic electroluminescent panels, printed circuit boards, micro machines, DNA chips and micro plants, in particular ICs with LSI (large-scale integration) or VLSI (very-large-scale integration).

Nowadays, copper is customarily used as the low electrical resistance or wiring material in the electrical devices, in particular in the vias and interconnects contained in the ICs. The increasing use of copper and the ever decreasing dimensions of the electrical structures together with the ever increasing functionalities of the ICs require the use of low-k and ultra low-k materials in order to avoid problems with wiring resistance and wiring delay caused by high wiring capacities. These challenging developments have demanded and still demand the continuing optimization of the methods of manufacture and of the materials utilized therefore.

Upon forming a copper metal wiring, in particular, a process is used in which a copper multi-layer wiring is formed without etching copper by using a dual damascene process. Owing to the low etching resistance of copper, various kinds of dual damascene processes have been proposed. One example thereof comprises the formation of a copper layer and the formation of a low-k layer (e.g., SiOC layer) on top of the copper layer followed by the formation of a resist layer as the uppermost layer. Optionally, a metal nitride layer (e.g., TiN layer) can be formed on top of the low-k layer before the resist layer is applied. In another variant, a barrier anti-reflective layer (BARC) is interposed between the metal nitride layer and the resist layer.

Thereafter, the resist layer is selectively exposed to electromagnetic radiation or electron beams and developed to form a resist pattern ("first photo resist pattern"). Then, by using the first resist pattern as a mask pattern, the low-k or ultra low-k layer is partly dry-etched by way of a fluorine containing plasma. The joint use of a metal nitride layer in this process step is customarily designated as "hard mask technique". Thereafter, the first resist pattern is stripped away by an oxygen plasma ashing treatment. This way, wiring trenches are formed.

Next, another resist pattern ("second resist pattern") is newly formed as the uppermost layer on the remaining multilayer structure, and the remaining low-k or ultra low-k layer is again partly etched away by using the second photo resist pattern as a mask pattern, thereby forming the via holes which communicate with the wiring trenches and the copper interconnect wiring of the level below. Thereafter, the second photo resist pattern is also stripped away by oxygen plasma ashing treatment.

The wiring trenches and via holes are then filled with copper preferably by electroplating, thereby creating multi-layer copper wiring conductors.

The substrate for use in these processes may optionally be provided with a barrier layer (e.g., SiN layer or SiC layer) as an etch-stop layer between the copper layer and the low-k layer. In such a case, via holes and trenches are formed, and then, while the barrier layer exposed out on the substrate is kept as such or after the barrier layer has been removed, the photo resist is stripped away and, thereafter, the via holes and the wiring trenches are filled with copper.

In the above described dual damascene process, silicon deposition may readily occur, resulting from the low-k layer during the etching treatment and the oxygen plasma ashing treatment for forming the via holes on the trenches, and this may form silicon deposits around the opening of the trenches. In addition, a deposition that results from the resists may also occur. If these deposits are not completely removed, they can significantly decrease the yield in semiconductor production.

Accordingly, oxygen plasma ashing treatment has been used for the removal of the resist patterns and etching residues in conventional patterning for metal wiring. However, the development of ultra-micropatterning technology, a material having a lower dielectric constant, i.e. an ultra low-k material, must be used for the insulating low-k layer. At present, a process of using an ultra-low-k layer having a dielectric constant of 3 or less has been developed. However, the ultra low-k materials are poorly resistant or not resistant at all to ashing. Consequently, a process not including an oxygen plasma ashing step after etching must be employed, when such ultra-low-k materials are used.

To these end, so-called all-wet post-etch residue removal (PERR) processes have been developed and disclosed in the prior art.

The American patent application US 2003/0148624 A1 discloses a resist stripping composition for removing ashed and non-ashed resists, the said compositions containing quaternary ammonium hydroxides such as tetramethylammonium hydroxide (TMAH), and organic solvents such as ethanolamine, 1-amino-2-propanol, aminoethoxyethanol, 1-methylaminoethanol, dimethyl sulfoxide, N-methylpyrrolidone, diethyleneglycol monomethyl ether, or diethylenglycol monobutyl ether. The examples specifically disclose a resist stripping composition consisting of 5% by weight ethanolamine, 50% by weight dimethyl sulfoxide, 5% by weight propylene glycol, 0.05% by weight TMAH, 39.55% by weight of water, and 1 ppm or lower of dissolved oxygen, and a resist stripping composition consisting of 28% by weight 1-amino-2-propanol, 62% by weight N-methylpyrrolidone, 1% by weight TMAH, 9% by weight water, and 1 ppm of dissolved oxygen. These prior art resist stripping compositions are used in the process wherein the resists have to be pre-cleaned with a particular cleaning composition containing 1% by weight or more of hydrogen peroxide and ammonia or ammonium ion.

The American patent application US 2004/0106531 A1 and the corresponding American patent U.S. Pat. No. 7,250, 391 B2 disclose resist stripping compositions containing (A) a salt of hydrofluoric acid and a base not containing a metal, (B1) a water-soluble organic solvent, (C) an acid selected from the group consisting of organic acids and inorganic acids, and (D) water as the obligatory ingredients, and (E) an ammonium salt as an optional ingredient.

Ethanolamine, isopropanolamine, 2-(2-aminoethylamino) ethanol, N-methylethanolamine, N-ethylethanolamine, dicyclohexylamine, and TMAH may be used as the base not containing a metal. The complete (A)-component is preferably used in an amount of from 0.01 to 1% by weight, based on the weight of the resist stripping composition. When used together with diphosphonic acid (C), the base not containing a metal can be used in an amount of from 0.1 to 20% by weight, based on the weight of the resist stripping composition.

Diethyleneglycol monoethyl ether, diethyleneglycol monobutyl ether, N-methylpyrrolidone, and dimethyl sulfoxide can be used as the water-soluble organic solvents (B).

The international patent application WO 2004/100245 A1 discloses a resist stripping composition comprising $H_2SiF_6$ and/or $HBF_4$, preferably in an amount of from 0.001 to 5% by weight of the composition, an organic solvent, preferably in an amount of from 50 to 89% by weight of the composition, optionally an amine, preferably in an amount of less than 1.5% by weight of the composition, a corrosion inhibitor, preferably in an amount of 0.001 to 10% by weight of the composition, and water as the balance. N-methylpyrrolidone, diethyleneglycol monomethyl ether, or diethyleneglycol monobutyl ether can be used as the organic solvent. Isopropanolamine, 2-(2-aminoethylamino)ethanol, 2-(2-aminoethoxy)ethanol, and ethanolamine can be used as the optional amine. TMAH is only used in a so-called high water embodiment which is substantially free of organic solvents.

The related American patent applications US 2005/0176259 A1 and US 2007/0298619 A1 disclose a resist stripping comprising a quaternary ammonium hydroxide such as TMAH, preferably an amount of from 1 to 20% by weight of the composition, water, preferably in an amount of from 5 to 60% by weight of the composition, a water-soluble organic solvent, such as dimethyl sulfoxide, N-methylpyrrolidone, diethyleneglycol monomethyl ether, diethyleneglycol monobutyl ether, and a water-soluble amine, such as ethanolamine, isopropanolamine, diethylenetriamine, 2-(2-aminoethoxy)ethanol, or N-methylethanolamine, preferably in an amount of from 10 to 50% by weight of the composition. These prior art resist stripping compositions are used in a process wherein the patterned resists have to be pretreated with ozone water and/or aqueous hydrogen peroxide before being stripped.

The American patent application US 2005/0014667 A1 and its corresponding patent U.S. Pat. No. 7,399,365 B2 both disclose dilute aqueous resist stripping compositions comprising, for example, from 0.02 to 0.18% by weight of the composition of an ammonium fluoride, from 20 to 40% by weight of the composition of water, from 59 to 85% by weight of the composition of an amide and an ether solvent such as diethyleneglycol monoethyl ether diethyleneglycol monobutyl ether and N-methylpyrrolidone, from 0.2 to 5% by weight of an acid, from 0.2 to 5% by weight of an alkanolamine such as ethanolamine, isopropanolamine, N-methylethanolamine, or 2-(2-aminoethylamino)ethanol, and from 0.2 to 5% by weight of the composition of a quaternary ammonium compound such as TMAH. These prior art resist stripping compositions can be used for removing ashed and non-ashed resists.

The related American patent applications US 2005/0266683 A1 and US 2005/0263743 A1 both disclose a resist stripping composition comprising a quaternary ammonium hydroxide such as TMAH, preferably in an amount of from 1 to 30% by weight of the composition, water, preferably in an amount of from 15 to 94% by weight of the composition, an organic polar solvent such as N-methylpyrrolidone, dimethyl sulfoxide, 3-amino-1-propanol and ethanolamine, or mixtures thereof, preferably in an amount of from 25 to 85% by weight, and hydroxyl amine or a hydroxyl amine derivative, preferably in an amount of from 2 to 12% by weight of the composition. Allegedly, the use of an ashing step employing an oxygen plasma can be dispensed with.

The American patent application US 2006/0016785 A1 discloses aqueous and non-aqueous resist stripping compositions for removing ashed and non-ashed resists, the said compositions comprising from 0.5 to 15% by weight of the composition of a quaternary ammonium compound such as TMAH or tetrabutylammonium hydroxide (TBAH), an organic solvent such as diethyleneglycol monomethyl ether or diethylene glycol monobutyl ether.

The Example K specifically discloses a resist stripping composition consisting of 65% by weight propyleneglycol methyl ether, 39% by weight propyleneglycol propyl ether, 0.4% by weight water, 0.6% by weight TBAH, 3% by weight p-toluenesulfonic acid, and 1% by weight ethanolamine. The Example L specifically discloses a resist stripping composition being free of water and consisting of 56% by weight propyleneglycol propyl ether, 35.5% by weight propyleneglycol methyl ether, 0.5% by weight TBAH, 6% by weight p-toluenesulfonic acid, and 2% by weight of ethanolamine. The Example M specifically discloses a resist stripping composition consisting of 91.5% by weight propyleneglycol methyl ether, 0.2% by weight water, 0.2% by weight TBAH 6% by weight p-toluenesulfonic acid, and 2% by weight ethanolamine. According to the Examples C, E, F, J, N, O, A5, P and S, TMAH is used in higher amounts ranging from 2.5% by weight to 5.5% by weight. According to the list of abbreviations used in these Examples, both PGME and PGPE should mean propyleneglycol methyl ether. However, it is assumed that PGPE really means propyleneglycol propyl ether.

The American patent application US 2008/0280452 A1 discloses a resist stripping composition for non-ashed resists having a high water content and comprising a quaternary ammonium hydroxide such as TMAH, TBAH or methyltripropylammonium hydroxide (MTPAH) preferably in an amount of from 1 to 20% by weight of the composition, a water-soluble organic solvent such as dimethyl sulfoxide and N-methylpyrrolidone, and a water-soluble amine such as ethanolamine, N-methylethanolamine and 2-(2-aminoethoxy)ethanol, preferably in an amount of from 10 to 15% by weight of the composition. In particular, Table 2 discloses resist stripping compositions e.g. consisting of 10% by weight TMAH, 50% by weight dimethyl sulfoxide, and 40% by weight water (stripping solution G), 5% by weight TBAH, 30% by weight N-methylpyrrolidone, 30% by weight dimethyl sulfoxide, and 25% by weight water (stripping solution J), or 5% by weight MTPAH, 30% by weight dimethyl sulfoxide, 15% by weight N-methylpyrrolidone, 20% by weight water and 30% by weight 2-(2-aminoethoxy)ethanol. However, for a complete removal of the resists, a pretreatment with ozone water and/or aqueous hydrogen peroxide is mandatory.

The prior art resist stripping composition exhibit various drawbacks and disadvantages.

Thus, the resist stripping compositions containing N-methylpyrrolidone prompt concerns over environment, health and safety (EHS).

Compositions having a high water content and/or a high quaternary ammonium hydroxide content can damage the low-k and, in particular, the ultra low-k materials used in the modern IC technology. Due to the complexing and chelating power of hydroxyl amine and hydroxyl amine derivatives, the compositions containing these compounds can cause corrosion of copper vias and interconnects. Both effects can lead to a partial or a complete failure of the IC.

The removal rate for resists, post-etch residues (PER) and barrier anti-reflective layers (BARC) of resist stripping compositions having a high content of organic solvents strongly depends on the concentration of the quaternary ammonium hydroxides. This strong dependence on the concentration renders the optimization of the compositions difficult and complex. In particular, if high concentrations are required in order to achieve high removal rates, the aforementioned disadvantageous effects are again obtained.

Quite often, the known resist stripping compositions exhibit different removal rates for unchanged resists on the one hand and the PER and the BARC on the other hand. In most cases, the PER and the BARC are much more difficult to remove than the unchanged resists. This is because the PER are having a chemical nature different from the resists and because the BARC are customarily highly cross-linked materials which are not easy to dissolve or to disperse.

Moreover, the prior art resist stripping compositions may satisfactorily remove the resists but exhibit unsatisfactory removal rates as far as the etch residues, which have a complex composition and, inter alia, contain Teflon-like materials and titanium and/or silicon containing materials, are concerned.

Last but not least, many processes utilizing prior art resist stripping compositions require a pre-treatment step before the removal step. Quite often, ozone water and/or aqueous hydrogen peroxide is or are used. Apart from the concerns over EHS, these strongly oxidizing solutions can damage the low-k and ultra low-k materials, in particular the carbon-doped silicon oxide (SiOC) materials by oxidizing the carbon therein contained.

Three-dimensional (3D) technologies and architectures are becoming increasingly important in the IC technology because they hold the promise to further enable system performance increase in a time where device skaling has become increasingly challenging.

For 3D applications, photoresists are employed for patterning through silicon vias (TSV) and also for plating and bumping (3D Stacked Integrated Circuit, 3D-SIC; 3D Wafer Level Packaging, 3D-WLP).

Customarily, few micrometer thick positive-tone photoresists are used for 3D-WLP TSV etch. A combination of dry silicon etch and wet photoresist stripping is commonly used. In addition, negative-tone photoresists can also be used as mold for copper plating and micro-bumping applications. However, the prior art resist stripping compositions are not always capable to remove both, negative-tone and positive-tone photoresists, in the same manner.

Quite often, plasma damaged photoresist, i.e., post etch residues, PER, are difficult to remove. In order to get rid of such PER, the application of an additional physical force is often necessary.

For the 3D-WLP approach, the patterning of TSV and the micro-bumping is often done on thinned silicon wafers which are bonded on carriers. In this case, the resist stripping compositions must also be compatible with the glue material.

In view of this, it would be highly desirable to have a resist stripping composition at hand which composition is capable of removing positive-tone and negative-tone photoresists and PER in the same most advantageous manner without damaging blanket wafers surfaces, patterned wafer structures and the glue material bonding thinned silicon wafers on carriers. However, the prior art photoresist strippers are not able or are only partially able to fulfill these challenging requirements.

OBJECTS OF THE INVENTION

Therefore, it has been the object of the present invention to provide new resist stripping compositions and new methods for manufacturing electrical devices making use of the new resist stripping compositions, which compositions and methods no longer exhibit the drawbacks and disadvantages of the prior art set out about above.

In particular, the new resist stripping compositions should no longer contain N-methylpyrrolidone, in order to dispense with the environmental, health and safety (EHS) problems caused by this solvent.

The new resist stripping compositions should no longer exhibit the disadvantageous effects associated with a high water content and/or a high quaternary ammonium hydroxide content and should no longer damage the low-k and, in particular, the ultra low-k materials used in the modern IC technology. In addition, the new resist stripping compositions should no longer contain hydroxyl amine and hydroxyl amine derivatives so that the risk of the corrosion of copper vias and interconnects is minimized or, ideally, completely avoided.

The removal rate for resists, post-etch residues (PER) and barrier anti-reflective layers (BARC) of the new resist stripping compositions having a high content of organic solvents should no longer depend on the concentration of the quaternary ammonium hydroxides. This way, the optimization and the adaption of the new compositions to changing manufacturing parameters should be rendered simple, straightforward and efficient, so that high concentrations are no longer required in order to achieve high removal rates.

The new resist stripping compositions should exhibit the same or essentially the same removal rates for the unchanged resists on the one hand and the PER and the BARC on the other hand, so that the different chemical nature of the PER and the BARC offers no longer an obstacle for their efficient removal.

Moreover, the new resist stripping compositions should not only excellently remove the resists but also exhibit excellent removal rates as far as the PER, which have a complex composition and contain Teflon-like materials and titanium and/or silicon containing materials, are concerned.

The new methods of manufacturing electrical devices, in particular semiconductor integrated circuits (ICs), liquid crystal panels, organic electroluminescent panels and printed circuit boards, micro machines, DNA chips and micro plants, especially ICs, utilizing the new resist stripping compositions should no longer require a pre-treatment step before the removal step. In particular, the use of ozone water and/or aqueous hydrogen peroxide should be completely dispensed with so that the concerns over EHS associated therewith no longer exist and the damage of the low-k and ultra-low-k materials by these strongly oxidizing solutions can be avoided completely. On the whole, the new methods of manufacture should yield electrical devices which are completely or essentially free from defects, exhibit an excellent functionality and have a long service life.

Last but not least, the new resist stripping compositions should be capable of being most advantageously used in 3D technologies for the manufacture of 3D architectures, in particular, in the field of patterning through silicon vias (TSV) and also for plating and bumping (3D Stacked Integrated Circuit, 3D-SIC; 3D Wafer Level Packaging, 3D-WLP). In these applications, they should be capable of removing positive-tone and negative-tone photoresists and PER in the same most advantageous manner without damaging blanket wafers surfaces, patterned wafer structures and the glue material bonding thinned silicon wafers on carriers.

SUMMARY OF THE INVENTION

Accordingly, the novel liquid composition has been found, the said composition being free from N-alkylpyrrolidones and hydroxyl amine and hydroxyl amine derivatives, having a dynamic shear viscosity at 50° C. of from 1 to 10 mPas as measured by rotational viscometry and comprising based on the complete weight of the composition,
(A) of from 40 to 99.95% by weight, based on the complete weight of the composition, of at least one polar organic solvent, selected from the group consisting of solvents exhibiting in the presence of from 0.06 to 4% by weight of dissolved tetramethylammonium hydroxide (B), the weight percentage being based on the complete weight of the respective test solution (AB), a constant removal rate at 50° C. for a 30 nm thick polymeric barrier anti-reflective layer containing deep UV absorbing chromophoric groups,
(B) of from 0.05 to <0.5% by weight, based on the complete weight of the composition, of at least one quaternary ammonium hydroxide, and
(C) <5% by weight, based on the complete weight of the composition, of water.

Hereinafter, the novel liquid composition being free from N-alkylpyrrolidones and hydroxyl amine and hydroxyl amine derivatives and having a dynamic shear viscosity at 50° C. of from 1 to 10 mPas as measured by rotational viscometry is designated as "composition or compositions of the invention" as the case may be.

Additionally, the novel method for preparing a liquid composition being free from N-alkylpyrrolidones and hydroxyl amine and hydroxyl amine derivatives, the said method comprising the steps of
(I) selecting at least one polar organic solvent (A) exhibiting in the presence of from 0.06 to 4% by weight of dissolved tetramethylammonium hydroxide (B), the weight percentage being based on the complete weight of the respective test solution (AB), a constant removal rate at 50° C. for a 30 nm thick polymeric barrier anti-reflective layer containing deep UV absorbing chromophoric groups,
(II) mixing, based on the complete weight of the resulting mixture,
  (A) of from 40 to 99.95% by weight of at least one of the selected polar organic solvents,
  (B) of from 0.05 to <0.5% by weight of at least one quaternary ammonium hydroxide, and
  (C) <5% by weight of water
  in the absence of N-alkylpyrrolidones and hydroxyl amine and hydroxyl amine derivatives, and
(III) adjusting the dynamic shear viscosity at 50° C. of the mixture resulting from the process step (II) to 1 to 10 mPas as measured by rotational viscometry.

Hereinafter, the novel method for preparing a liquid composition being free from N-alkylpyrrolidone and hydroxyl amine and hydroxyl amine derivatives is referred to as the "method of preparation of the invention".

Moreover, the novel method for manufacturing electrical devices has been found, the said method comprising the steps of
(1) applying an insulating dielectric layer consisting of at least one low-k or ultra-low-k material on top of a substrate,
(2) applying a positive or a negative resist layer on top of the insulating dielectric layer (1),
(3) selectively exposing the resist layer to electromagnetic radiation or corpuscular radiation,
(4) developing the resist layer (3) to form a resist pattern,
(5) dry-etching the insulating dielectric layer (1) using the resist pattern (4) as a mask to form wire trenches and/or via holes communicating with the substrate surface,
(6) selecting at least one polar organic solvent (A) exhibiting in the presence of from 0.06 to 4% by weight of dissolved tetramethylammonium hydroxide (B), the weight percentage being based on the complete weight of the respective test solution (AB), a constant removal rate at 50° C. for a 30 nm thick polymeric barrier anti-reflective layer containing deep UV absorbing chromophoric groups,
(7) providing at least one resist stripping composition being free from N-alkylpyrrolidones and hydroxyl amine and hydroxyl amine derivatives and having a dynamic shear viscosity at 50° C. of from 1 to 10 mPas as measured by rotational viscometry and comprising, based on the complete weight of the composition,
  (A) of from 40 to 99.95 of at least one polar organic solvent selected in accordance with the process step (6),
  (B) of from 0.05 to <0.5% by weight, based on the complete weight of the composition, of at least one quaternary ammonium hydroxide, and
  (C) <5% by weight, based on the complete weight of the composition, of water,
(8) removing the resist pattern and the post-etch residues by an all-wet process using at least one resist stripping composition prepared in accordance with the process step (7), and
(9) filling the wire trenches and via holes with at least one material having a low electrical resistivity.

Hereinafter, the novel method for manufacturing electrical devices is referred to as the "manufacturing method of the invention".

Additionally, the new use of a liquid composition for removing negative-tone and positive-tone photoresists and post etch residues in the manufacture of 3D Stacked Integrated Circuits and 3D Wafer Level Packagings by way of patterning Through Silicon Vias and/or by plating and bumping has been found, the said liquid composition being free from N-alkylpyrrolidones and hydroxyl amine and hydroxyl amine derivatives, having a dynamic shear viscosity at 50° C. of from 1 to 10 mPas as measured by rotational viscometry and comprising based on the complete weight of the composition,
  (A) of from 40 to 99.95% by weight, based on the complete weight of the composition, of at least one polar organic solvent, selected from the group consisting of solvents exhibiting in the presence of from 0.06 to 4% by weight of dissolved tetramethylammonium hydroxide (B), the weight percentage being based on the complete weight of the respective test solution (AB), a constant removal rate at 50° C. for a 30 nm thick polymeric barrier anti-reflective layer containing deep UV absorbing chromophoric groups, (B) of from 0.05 to <0.5% by weight, based on the complete weight of the composition, of at least one quaternary ammonium hydroxide, and (C) <5% by weight, based on the complete weight of the composition, of water.

Hereinafter, the new use of the liquid composition is referred to as the "use of the invention".

Advantages of the Invention

In view of the prior art discussed above, it was surprising and could not be expected by the skilled artisan that the objects underlying the present invention could be solved by the composition of the invention, the preparation of the invention, and the manufacturing method of the invention.

In particular, the compositions of the invention no longer contained N-alkylpyrrolidone, in particular, N-methylpyrrolidone, so that the environmental, health and safety (EHS) problems associated therewith were no longer present.

The compositions of the invention no longer exhibited the disadvantageous effects associated with a high water content and/or a high quaternary ammonium hydroxide content and no longer damaged the low-k and, in particular, the ultra low-k materials used in the modern IC technology. In addition, the compositions of the invention no longer contained hydroxyl amine and hydroxyl amine derivatives so that the risk of the corrosion of copper vias and interconnects was considerably minimized or, in many cases, completely avoided.

In the concentration range of from 0.06 to 4% by weight of the composition of the invention, the removal rate for resists, post-etch residues (PER) and barrier anti-reflective layers (BARC) of the compositions of the invention no longer depended on the concentration of the quaternary ammonium hydroxides. This way, the optimization and the adaption of the compositions of the invention to changing manufacturing parameters were rendered simple, straightforward and efficient, so that high concentrations of quaternary ammonium hydroxides were no longer required in order to achieve high removal rates.

The compositions of the invention exhibited the same or essentially the same removal rates for the unchanged resists on the one hand and the PER and the BARC on the other hand, so that the different chemical nature of the PER and the BARC offered no longer an obstacle for their efficient removal.

Moreover, the compositions of the invention did not only excellently remove the resists but also exhibited excellent removal rates as far as the PER, which have a complex composition and contain Teflon-like materials and titanium and/or silicon containing materials, were concerned.

On the whole, the compositions of the invention could be stored, handled and used without causing environmental, health and safety (ESH) problems.

The method of preparation of the invention could be carried out in a simple, economical, safe and excellently reproducible way without causing ESH-problems and did not require any particular and special facilities and safety measures. It yielded liquid compositions, in particular compositions of the invention, which had excellent applicational and property profiles The manufacturing method of the invention for electrical devices, in particular semiconductor integrated circuits (ICs), liquid crystal panels, organic electroluminescent panels and printed circuit boards, micro machines, DNA chips and micro plants, especially ICs, no longer required a pre-treatment step before the removal step. In particular, the use of ozone water and/or aqueous hydrogen peroxide could be completely dispensed with so that the concerns over EHS associated therewith no longer existed and the damage of the low-k and ultra-low-k materials by these strongly oxidizing solutions could be avoided completely. On the whole, the manufacturing method of the invention yielded electrical devices which were completely or essentially free from defects, exhibited excellent functionalities and had a long service life.

Furthermore, the compositions of the invention were most particularly suited for the use of the invention in 3D technologies for the manufacture of 3D architectures, in particular, in the field of patterning through silicon vias (TSV) and also for plating and bumping (3D Stacked Integrated Circuit, 3D-SIC; 3D Wafer Level Packaging, 3D-WLP). In these applications, they were capable of removing positive-tone and negative-tone photoresists and PER very fast in the same most advantageous manner without damaging blanket wafers surfaces, patterned wafer structures and the glue material bonding thinned silicon wafers on carriers.

DETAILED DESCRIPTION OF THE INVENTION

In its broadest aspect, the present invention is directed to a liquid composition which is free from N-alkylpyrrolidones, in particular N-methylpyrrolidone and N-ethylpyrrolidone, as well as hydroxyl amine and hydroxyl amine derivatives, in particular hydroxyl amine derivatives as disclosed in the American patent applications US 2005/0266683 A1, page 4, paragraphs [0046] to [0050], and US 2005/0263743 A1, page 4, paragraph [0057] to page 5, paragraph [0063].

In the context of this invention, the characteristic "liquid" means that the composition of the invention is liquid at least at room temperature (i.e. 23° C.), preferably at least at 0° C. and most preferably at least at −10° C.

Moreover, in the context of this invention, the characteristic "free from" means that the relevant compounds cannot be detected in the composition of the invention with the known state-of-the-art analytical methods for qualitatively and/or quantitatively detecting N-alkylpyrrolidones hydroxyl amine and hydroxyl amine derivatives, e.g., gas chromatography and/or mass spectrometry.

The composition of the invention exhibits a dynamic shear viscosity at 50° C. as measured by rotational viscometry of from 1 to 10 mPas, preferably 2 to 8 mPas, more preferably 1.5 to 7 mPas and most preferably 2 to 6 mPas. Preferably, the composition of the invention also exhibits a dynamic shear viscosity at 23° C. as measured by rotational viscometry of from 2 to 20 mPas, more preferably 3 to 16 mPas and most preferably 3 to 14 mPas.

The composition of the invention can be a dispersion, i.e. an emulsion or a suspension, or a homogeneous composition, wherein all the ingredients are molecularly dispersed. Preferably, the composition of the invention is a homogeneous, molecularly dispersed composition.

The composition of the invention comprises, based on the complete weight of the composition, of from 40, preferably of from 45 and most preferably of from 50% by weight to 99.95% by weight or, more preferably 99.94% by weight, of at least one polar organic solvent (A). The polar organic solvent (A) can be aprotic or protic polar.

The polar organic solvent (A) is selected from the group consisting of solvents which exhibit in the presence of dissolved tetramethylammonium hydroxide (B) in an amount of from 0.06 to 4% by weight, based on the complete weight of the respective test solution (AB), at 50° C. a constant removal rate for a 30 nm thick polymeric barrier anti-reflective layer containing deep UV absorbing chromophoric groups.

The characteristic "constant" means that, in the given range, the removal rate is completely or virtually independent from the concentration of the tetramethylammonium hydroxide (B).

For purposes of measuring the removal rate, the polymeric barrier anti-reflective layer is preferably applied onto a semiconductor wafer surface. Thereafter, the barrier anti-reflective layer on top of the semiconductor wafer surface is exposed to test solutions (AB) of tetramethylammonium hydroxide (B) in the polar organic solvent (A) to be tested having different concentrations of (B).

Preferably, tetramethylammonium hydroxide (B) is added as an aqueous solution containing, based on the complete weight of the aqueous solution, 25% by weight of tetramethylammonium hydroxide (B). Therefore, the test solutions (AB) can contain, based on the complete weight of the test solution, up to 16% by weight of water (C).

Preferably, the test solutions (AB) are stirred during the tests at a constant rotational speed, more preferably at 50 to 200 rpm, even more preferably at 75 to 125 rpm and most preferably at 100 rpm.

In all the tests, the barrier anti-reflective layers on top of the semiconductor wafer surfaces are exposed for the same time to the test solutions (AB). Preferably, the exposure time is 180 s.

After the exposure, the semiconductor wafer pieces carrying the barrier anti-reflective layers are removed from the test solutions (AB), rinsed with a polar organic solvent, preferably isopropanol, and, thereafter, with deionized water and dried with a dry non-reactive gas, preferably nitrogen. Most preferably, the rinsing and drying steps are carried out at moderate temperatures, preferably at temperatures of from 23 to 50° C.

After the drying step, it is examined by way of known and customary spectroscopic methods whether the barrier anti-reflective layers are still present. Preferably, transmission FTIR (Fourier Transformation IR-Spectroscopy) is used to this end.

In case that the barrier anti-reflective layers should still be present, their thickness is measured by way of known and customary methods for measuring the thickness of thin layers. Preferably, transmission FTIR and/or interferometry is or are used to this end.

Most preferably, the barrier anti-reflective layers are completely removed during the exposure to the test solutions (AB).

For the selective tests described above, any known polymeric anti-reflective coating compositions, as for example, described in the American patent U.S. Pat. No. 5,919,599, column 3, line 40 to column 16, line 36 and column 17, line 25 to column 18, line 25 in conjunction with the FIG. 1, can be used for preparing the polymeric barrier anti-reflective layers containing deep UV chromophoric groups.

As it is known in the art, that, due to their polymeric and cross-linked nature, the barrier anti-reflective layers are significantly more difficult to remove than the patterned resists, the selective tests guarantee that the organic polar solvents (A) are selected such that the compositions of the invention are even more so capable of completely removing the patterned resists and the post-etch residues together with the barrier anti-reflective layers, most preferably within 180 s without or essentially without redeposition.

Preferably, the polar organic solvents (A) are having a boiling point at atmospheric pressure above 100° C., more preferably above 120° C. and most preferably above 150° C.

More preferably, the polar organic solvents (A) are having a flashpoint as measured in a closed cup up 50° C., more preferably above 55° C. and most preferably above 60° C.

Most preferably, the polar organic solvent (A) is selected from the group consisting of aliphatic polyamines comprising at least two primary amino groups, aliphatic alkanolamines having at least one carbon chain of at least 3 carbon atoms between one primary amino group and one hydroxyl group, aliphatic sulfoxides, and N-substituted imidazoles. Particularly, the solvent (A) is selected from the group consisting of diethylenetriamine (boiling point 207° C., flashpoint 102° C.), N-methyl imidazole (boiling point 198° C., flashpoint 92° C.), 3-amino-1-propanol (boiling point 187° C., flashpoint 101° C.), 5-amino-1-pentanol (boiling point 222° C., flashpoint 65° C.), and dimethyl sulfoxide (boiling point 189° C., flashpoint 87° C.).

The composition of the invention comprises, based on the complete weight of the composition, of from 0.05 to <0.5% by weight, preferably of from 0.06 to <0.5% by weight of at least one quaternary ammonium hydroxide.

Preferably, the quaternary ammonium hydroxide (B) is selected from the group consisting of tetramethylammonium, tetraethylammonium, tetrapropylammonium, tetrabutylammonium, benzyltrimethylammonium, and (2-hydroxyethyl) ammonium hydroxide, in particular tetramethylammonium hydroxide.

Additionally, the composition of the invention comprises, based on the complete weight of the composition of the invention, <5% by weight, preferably <4% by weight, more preferably <3% by weight and most preferably <2% by weight of water. The water content can also be so low as to be undetectable by known and customary methods for the qualitative and quantitative detection of water.

The composition of the invention can also contain at least one additional component selected from the group consisting of polar organic solvents (D) different from the solvents (A), corrosion inhibitors (E), chelating agents (F), fluoride salts (G), and surfactants (H).

Preferably, the polar organic solvent (D) is selected from the group of solvents exhibiting, in the presence of from 0.06 to 4% by weight of dissolved tetramethylammonium hydroxide (B), the weight percentages being based on the complete weight of the test solution (DB), a removal rate at 50° C. for a 30 nm thick polymeric barrier anti-reflective layer containing deep UV absorbing chromophoric groups which increases with increasing concentration of tetramethylammonium hydroxide (B).

Also here, tetramethylammonium hydroxide (B) is preferably added as an aqueous solution containing, based on the complete weight of the aqueous solution, 25% by weight of tetramethylammonium hydroxide (B). Therefore, the test solutions (DB) can contain, based on the complete weight of the test solution, up to 16% by weight of water (C).

The removal rates of the test solutions (DB) are determined in the same way as described above for the test solutions (AB).

Preferably, the removal rates of the test solutions (DB) are 0 nm to 100 nm under the conditions set out above at a concentration of 1% by weight of tetramethylammonium hydroxide (B), based on the complete weight of the test solution (DB).

Preferably, the polar organic solvents (D) are having a boiling point at atmospheric pressure above 100° C., more preferably above 120° C. and most preferably above 150° C.

More preferably, the polar organic solvents (D) are having a flashpoint as measured in a closed cup up 50° C., more preferably above 55° C. and most preferably above 60° C.

Most preferably, the polar organic solvent (D) is selected from the group consisting of alkanol amines, alkylene glycol monoalkyl ethers, N-substituted piperidines, N-substituted cyclic ureas and N-substituted imidazoles, particularly, ethanolamine (boiling point 172° C., flashpoint 85° C.), N-methylethanolamine (boiling point 160° C., flashpoint 72° C.), N-ethylethanolamine (boiling point 168° C., flashpoint 78° C.), isopropanolamine (boiling point 159° C., flashpoint 71° C.), 2-(2-aminoethylamino)ethanol (boiling point 243° C., flashpoint 144° C.), 2-(2-aminoethoxy)ethanol (boiling point 223 to 242° C., flashpoint 127° C.), diethyleneglycol monoethyl ether (boiling point 193° C., flashpoint 93° C.), diethyleneglycol monobutyl ether (boiling point 230° C., flashpoint 107° C.), N-(2-hydroxyethyl)piperidine (boiling point 198 to 203° C., flashpoint 83° C.), 1,3-dimethyl-3,4,5,6-tetrahydro-(1H)-pyrimidinone (boiling point 246° C., flashpoint 121° C.), N-(3-aminopropyl)imidazole (boiling point 296° C., flashpoint 154° C.), and dicyclohexylamine (boiling point 256° C., flashpoint 105° C.).

The concentration of the polar solvent (D) in the composition of the invention can vary broadly. However, the concentration should only be so high that the organic polar solvent (A) still mainly determines the property profile of the composition of the invention. Preferably, the weight ratio of polar organic solvent (A) to polar organic solvent (B) is in the range of from 2:1 to 1:2, more preferably 1.5:1 to 1:1.5 and most preferably 1.2:1 to 1:1.2.

In principle, any known corrosion inhibitor (E) for metals can be used. Preferably, the corrosion inhibitor is selected from the group consisting of copper corrosion inhibitors (E), as described in for example,
the international patent application WO 2004/100245 A1, page 9, paragraph [0030] to page 10, paragraph [0031],
the American patent application US 2005/0176259 A1, page 4, paragraph [0049] to page 5, paragraph [0059],
the American patent application US 2005/0263743 A1, page 5, paragraph [0067] to page 6, paragraph [0073], and
the American patent application US 2008/0280452 A1, page 3, paragraph [0045] to page 4, paragraph [0053].

The copper corrosion inhibitors (E) may be used in broadly varying amounts. Preferably, they are used in the customary and effective amounts disclosed in the above-mentioned prior art.

In principle, any known chelating agent (F) can be used in the composition of the invention. Preferably, the chelating agent (F) is selected from the group of copper chelating agents (F), in particular, from the group of copper chelating agents (F) described in, for example, in the American patent applications
US 2004/0106531 A1, page 6, paragraph [0074], and
US 2005/0263743 A1, page 5, paragraph [0070] to page 6, paragraph [0073] in conjunction with paragraph [0078].

Quite often, such copper chelating agents (F) are also used as the copper corrosion inhibitors (E).

The copper chelating agents (F) may be used in broadly varying amounts. Preferably, they are used in the customary and effective amounts disclosed in the above-mentioned prior art.

In principle, any known fluoride salt (G) may be used in the compositions of the intervention. Preferably, the fluoride salt (G) is selected from the group of salts of hydrofluoric acid and a base not containing a metal, as described in the American patent application US 2004/0106531 A1, page 3, paragraphs [0035] to [0041]. The fluoride salts (G) may be used in broadly varying amounts. Preferably, they are used in the customary and effective amounts disclosed in the cited prior art, in particular, in paragraph [0041].

In principle, any known surfactant (H) may be used in the composition of the invention. Preferably, the surfactant is selected from the group of surfactants as described in the American patent application US 2008/0280452 A1, page 4, paragraph [0054] to page 5, paragraph [0061]. The surfactants (H) may be used in broadly varying amounts. Preferably, they are used in the customary and effective amounts disclosed in the cited prior art, in particular in paragraph [0061].

The compositions of the invention can be prepared in various ways. Preferably, they are prepared according to the method of production of the invention. It is an advantage of the present invention that the method of production of the invention can also be used for preparing other compositions than the compositions of the invention.

In the first process step of the method of production of the invention, at least one polar organic solvent (A) is selected as described hereinbefore.

In the second process step of the method of production of the invention,
(A) of from 40, preferably of from 45 and most preferably of from 50% by weight to 99.95% by weight or, more preferably, 99.94% by weight of at least one of the selected polar organic solvents,
(B) of from 0.05% or, more preferably, of from 0.6% by weight to <0.5% by weight of at least one quaternary ammonium hydroxide as described hereinbefore, and
(C) <5, preferably <4, more preferably <3 and most preferably <2% by weight of water,
the weight percentages each being based on the complete weight of the composition and, in particular the composition of the invention.

At least one additional component selected from the group consisting of polar organic solvents (D) different from the solvents (A), corrosion inhibitors (E), chelating agents (F), fluoride salts (G), and surfactants (H) described hereinbefore can be added in the first process step or in a separate process step preferably in the preferred amounts disclosed in the cited prior art.

It is essential for the method of production of the invention that the above-mentioned ingredients are mixed together in the absence of the N-alkylpyrrolidones, hydroxyl amine and hydroxyl amine derivatives as described above.

In the third process step of the method of production of the invention, the shear viscosity at 50° C. of the mixture resulting from the second process step is adjusted to 1 to 10 mPas, preferably 2 to 8 mPas, more preferably 1.5 to 7 mPas and most preferably 2 to 6 mPas.

The process step can be carried out as a separate step or can be integrated into each of the other process steps of the method of production of the invention. The latter can be accomplished by carefully selecting the ingredients for the second process step such that the resulting mixture already exhibits the required dynamic viscosity.

Most preferably, the composition of the invention also exhibits a dynamic shear viscosity at 23° C. as measured by rotational viscometry of from 2 to 20 mPas, more preferably 3 to 16 mPas and most preferably 3 to 14 mPas.

Customary and standard mixing processes and mixing apparatuses such as agitated vessels, in-line dissolvers, high shear impellers, ultrasonic mixers, homogenizer nozzles or counterflow mixers, can be used for carrying out the mixing of the ingredients of the compositions, in particular of the compositions of the invention.

The compositions of the invention, the composition prepared in accordance with the method of production of the invention and, most preferably, the compositions of the invention prepared in accordance with the method of production of the invention can be used for various purposes. In particular, they are used in the manufacturing method of the invention.

The manufacturing method of the invention yields most advantageous electrical devices, in particular semiconductor integrated circuits (ICs), liquid crystal panels, organic electroluminescent panels, printed circuit boards, micro machines, DNA chips and micro plants, especially however, ICs with LSI or VLSI.

The manufacturing method of the invention comprises the step of applying an insulating dielectric layer consisting of at least one low-k or ultra-low-k on top of a substrate in the first process step.

Suitable low-k or ultra-low-k materials and suitable methods of preparing the insulating dielectric layers are described in, for example, the American patent applications US 2005/0176259 A1, page 2, paragraphs [0025] to [0027], US 2005/0014667 A1, page 1, paragraph [0003], US 2005/0266683 A1, page 1, paragraph [0003] and page 2, paragraph or US 2008/0280452 A1, paragraphs [0024] to [0026] or in the American patent U.S. Pat. No. 7,250,391 B2, column 1, lines 49 to 54.

Suitable substrates are particularly semiconductor substrates customarily used for the manufacture of ICs such as silicon wafers.

In the second process step, a positive or negative resist layer is applied on top of the insulating dielectric layer.

Suitable materials and methods for preparing positive and negative resist layers are described in, for example, the American patent U.S. Pat. No. 7,250,391 B2, column 1, lines 55 to 60 or in the American patent applications US 2005/0176259 A1, page 2, paragraphs [0029] and [0030], US 2006/0016785 A1, page 3, paragraphs [0025] to [0027] or US 2008/0280452 A1, paragraphs [0027] to [0029] and page 5, paragraph [0062].

In the third step, the resist layer is selectivity exposed to electromagnetic radiation or corpuscular radiation.

Preferably, UV-rays, deep UV-rays, excimer laser rays, in particular, KrF—, ArF— or $F_2$— excimer laser rays, or X-rays are used as the electromagnetic radiation. For the exposure, the resist layer may be exposed to a light source capable of emitting such active rays, as for example, low-pressure mercury lamps, high-pressure mercury lamps, ultra-high-pressure mercury lamps or xenon lamps, through a desired mask pattern.

The resist layer can also be directly exposed to corpuscular radiation, preferably, to electron beams.

Next, if desired, the resist pattern can be further baked (post-exposure baking).

In the fourth process step, the selectively exposed resist layer is developed with a developer, preferably an aqueous alkaline solution as described in, for example, the American patent application US 2008/0280452 A1, page 5, paragraph [0062], to yield the resist pattern.

In the fifth process step, the insulating dielectric layer is dry-etched using the resist pattern as a mask to form wire trenches and/or via holes communicating with the surface of the layer below, such as the surface of the substrate, the surface of the wiring of the level below, which wiring consists of at least one material having a low electrical resistivity, in particular copper or a copper alloy, or of the surface of an etch-stop layer, as for example, a silicon oxide nitride layer, interposed between the surface of the level below and the insulating dielectric layer to be dry-etched. Preferably, a fluorine containing plasma, in particular, on the basis of a fluorocarbon gas is used as a dry-etching agent.

In the dry-etching step, post-etch residues are generated, which must be removed in the course of the BEOL (back-end of the line) process of manufacturing electrical devices. These post-etch residues can have varying compositions comprising Teflon-like materials and titanium and/or silicon containing materials.

In the sixth process step, at least one polar organic solvent (A) is selected as described hereinbefore.

In the seventh process step, the at least one selected polar organic solvent (A) is used for preparing at least one composition of the invention as the resist stripping composition as described hereinbefore.

In the eighth process step, the at least one resist stripping composition prepared in accordance with the seventh process step is used for removing the resist pattern and the post-etch residues by an all-wet process.

The efficiency of the resist stripping process step eight can be enhanced by irradiating the resist stripping solution with ultrasound.

Preferably, the eighth process step is carried out at temperatures of from 0 to 70° C., more preferably 10 to 65° C. and most preferably 50 to 60° C.

It is one of the major advantages of the manufacturing method of the invention that, due to the use of the resist stripping composition of the invention, an ashing step, in particular, an ashing step using an oxygen containing plasma, or a pre-cleaning step, in particular, a precleaning step using ozone water or hydrogen peroxide, can be dispensed with. Moreover, no or only very little redeposition of hardened resist particles and/or post-etch residues can be observed.

After the stripping of the resist pattern and the post-etch residues, the resulting structure of wire trenches and/or via holes can be rinsed, in particular with deionized water, in order to remove any remaining resist stripping composition. Thereafter, the resulting structure can be dried, preferably with a dry non-reactive gas, in particular, nitrogen.

In the ninth process step, the wire trenches and via holes are filled with at least one material having a low electrical resistivity. Preferably, copper and copper alloys, most preferably copper, is used for this purpose. Preferably, known copper electroplating solutions and electroplating methods as, for example, described in the American patent application US 2006/0213780 A1 can be employed.

In the manufacturing process of the invention, a hard mask layer as described in, for example, the American patents U.S. Pat. No. 6,074,946 or U.S. Pat. No. 6,218,078 B1 or the American patent applications US 2008/0286977 A1, US 2008/10305441 A1, US 008/0305625 A1 or US 2009/0035944 A1 can be used. The said hard mask layer is selectively etched in the fifth process step using the resist pattern resulting from the fourth process step as the mask.

Alternatively, a barrier anti-reflective layer as, for example, described in the American patent U.S. Pat. No. 5,919,599 can be interposed between the resist layer and the insulating dielectric layer. Additionally, the barrier anti-reflective layer can also be interposed between the hard mask layer and the resist layer. In both cases, the barrier anti-reflective layer is selectively etched in the fifth process step using the resist pattern resulting from the fourth process step as the mask.

After having carried out the manufacturing process of the invention, the resulting surface can be polished by chemical mechanical polishing (CMP) employing methods and equipment well-known in the art of manufacturing electrical devices such as ICs. Thereafter, another layer of low-k dielectric material, optionally another hard mask layer, optionally another barrier anti-reflective layer, and, obligatorily, another resist layer can be applied, where after the manufacturing process of the invention is repeated.

The electrical devices prepared in accordance with the manufacturing method of the invention have an excellent functionality and a very long service life.

One of the most surprising advantages of the compositions of the invention is that, due to the high a boiling points of the organic polar solvents (A) and the optional organic polar solvents (D) used, they all exhibit a low vapor pressure at medium temperatures, in particular, in the temperature range of from room temperature up to 100° C. Moreover, due to the high flashpoints of the organic polar solvents (A) and the optional organic polar solvents (D) used, all the compositions of the invention are not readily flammable and not easily ignitable. Last but not least, the organic polar solvents (A) and the optional organic polar solvents (D) are not critical in terms of ESH. Therefore, this equally applies to compositions of the invention they are contained in. Consequently, the compositions of the invention can be prepared, stored, handled, used and disposed of without causing ESH problems.

An equally surprising advantage of the composition of the invention is that it is particularly suitable for the use of the invention.

According to the use of the invention, the composition of the invention is used for removing positive-tone and negative-tone resists as well as PER from blanket wafers and patterned wafers customarily used for the manufacture of 3D IC architectures which are also referred to as 3D-SIC and 3D-WLP. In these 3D IC architectures the interconnects are manufactured by way of TSV, plating and/or bumping, in particular micro-bumping (cf. imec, Scientific Report 2008, Advanced Packaging and Interconnect, 3D Interconnect and Packaging, 3D Stacked IC (3D-SIC), 3D-WLP: Micro-Bumping).

In the use of the invention, the composition of the invention is applied to the photoresists and PER to be removed from blanket and patterned wafers by known and customary methods and equipment. After the removal of the photoresists, the wafers are rinsed and dried. The success of the removal step, i.e., the complete absence of the photoresists ad PER, can be confirmed by optical, scanning electron microscopy (X-SEM), atomic force microscopy (AFM) and Fourier transform infrared (FTIR) spectroscopy inspection.

The compatibility of the composition of the invention with the glue material bonding thinned wafers on carriers, i.e., the presence of undamaged glue material, can be confirmed by the same methods.

Most surprisingly, the composition of the invention is capable of removing positive-tone and negative-tone photoresists and PER from the blanket and patterned wafers fast and completely without damaging the fine structures of the patterned wafers or the glue materials present.

EXAMPLES AND COMPARATIVE EXPERIMENTS

Example 1

The Selection of Polar Organic Solvents (A)

The polar organic solvents listed in the Table 1 were preselected according to their cleaning performance and to their high boiling points, high flashpoints and environmental, health and safety (EHS) ratings (i.e., the solvents should cause as little EHS problems as possible) from polar organic solvents (S) from the group consisting of acid chlorides, chloroformates, alcohols, diols, polyols, aldehydes, acetals, ketones, amines, amino alcohols, carboxylic acids and derivatives, heterocyclic compounds, ionic liquids, nitriles, urea derivatives, vinyl compounds, vinyl ethers, and aliphatic amides.

TABLE 1

The Preselection of Polar Organic Solvents

| Solvent code | Solvent | Boiling point/° C. | Flashpoint (closed cup)/° C. |
|---|---|---|---|
| S1 | diethylenetriamine | 207 | 102 |
| S2 | N-methyl imidazole | 198 | 92 |
| S3 | 3-amino-1-propanol | 187 | 101 |
| S4 | 5-amino-1-pentanol | 222 | 65 |
| S5 | dimethyl sulfoxide | 189 | 87 |
| S6 | N-(3-aminopropyl)imidazole | 296 | 154 |
| S7 | 2-(2-aminoethoxy)ethanol | 223 to 242 | 127 |
| S8 | N-ethylethanolamine | 168 | 78 |
| S9 | N-methylethanolamine | 160 | 72 |
| S10 | ethanolamine | 172 | 85 |
| S11 | isopropanolamine | 159 | 71 |
| S12 | 2-(2-aminoethylamino)ethanol | 243 | 144 |
| S13 | N-(2-hydroxyethyl)piperidine | 198 to 203 | 83 |
| S14 | 1,3-dimethyl-3,4,5,6-tetrahydro-(1H)-pyrimidinone | 242 | 121 |
| S15 | diethyleneglycol monobutyl ether | 230 | 107 |
| S16 | diethyleneglycol monoethyl ether | 193 | 93 |
| S17 | dicyclohexylamine | 256 | 105 |

For the final selection of the solvents (A) small pieces of silicon semiconductor wafers were coated with 30 nm thick polymeric barrier anti-reflective layers containing deep UV absorbing chromophoric groups. The polymeric barrier anti-reflective layers were cross-linked.

Next, test solutions of tetramethylammonium hydroxide (TMAH) (B) in each of the solvents (S) listed in the Table 1 were prepared. Each series of test solutions (SB) consisted of seven solutions having TMAH concentrations of 0.06, 0.1, 0.2, 0.5, 1.0, 2.0 and 4.0% by weight, the weight percentages being based on the complete weight of the respective test solution (SB), by adding the appropriate amounts of an aqueous solution containing 25% by weight TMAH.

The removal rate of each of the test solutions (SB) of each series was determined as follows:

A coated piece of the silicon semiconductor wafer was exposed in a beaker at 50° C. for 180 s to a test solution (SB) which was stirred with 100 rpm. Thereafter, the coated piece of the silicon semiconductor wafer was removed from the test solution (SB), rinsed with isopropanol and then with deionized water and dried at 50° C. with a stream of dry nitrogen.

After cooling down to room temperature, it was investigated by transmission FTIR and interferometry whether and, if yes, in what thickness the cross-linked polymeric barrier anti-reflective layer was still present.

The Table 2 gives an overview over the results obtained.

TABLE 2

The Selection of Polar Organic Solvents (A)

| Solvent code | Removal rate: nm removed at percent by weight TMAH: | | | | | | |
|---|---|---|---|---|---|---|---|
| | 0.06 | 0.1 | 0.2 | 0.5 | 1.0 | 2.0 | 4.0 |
| S1 | 30 | 30 | 30 | 30 | 30 | 30 | 30 |
| S2 | 30 | 30 | 30 | 30 | 30 | 30 | 30 |
| S3 | 30 | 30 | 30 | 30 | 30 | 30 | 30 |
| S4 | 30 | 30 | 30 | 30 | 30 | 30 | 30 |
| S5 | 30 | 30 | 30 | 30 | 30 | 30 | 30 |
| S6 | 0 | 0 | 0 | 0 | 0 | 7.5 | 30 |

TABLE 2-continued

The Selection of Polar Organic Solvents (A)

| Solvent code | Removal rate: nm removed at percent by weight TMAH: | | | | | | |
|---|---|---|---|---|---|---|---|
| | 0.06 | 0.1 | 0.2 | 0.5 | 1.0 | 2.0 | 4.0 |
| S7 | 0 | 0 | 0 | 0 | 0 | 30 | 30 |
| S8 | 0 | 0 | 0 | 0 | 0 | 7.5 | 30 |
| S9 | 0 | 0 | 0 | 0 | 0 | 17 | 30 |
| S10 | 0 | 0 | 0 | 0 | 2 | 16 | 30 |
| S11 | 0 | 0 | 0 | 0 | 9 | 16 | 30 |
| S12 | 0 | 0 | 0 | 0 | 4 | 20 | 30 |
| S13 | 0 | 0 | 0 | 0 | 5 | 15 | 30 |
| S14 | 0 | 0 | 0 | 0 | 1 | 30 | 30 |
| S15 | 0 | 0 | 0 | 0 | 4 | 15 | 30 |
| S16 | 0 | 0 | 0 | 0 | 0 | 6 | 30 |
| S17 | 0 | 0 | 0 | 0 | 23 | 15 | 30 |

The test results presented in the Table 2 demonstrate that only the removal rates of the solvents S1, S2, S3, S4, and S5 were independent from the TMAH concentration and that a complete removal of the cross-linked polymeric barrier anti-reflective layer could be achieved with concentrations as low as 0.06% by weight based on the complete weight of the respective test solution. Consequently, only the solvents S1, S2, S3, S4, and S5 qualified as polar organic solvents (A) to be used in accordance with the invention. The other solvents (S) tested only qualified as optional polar organic solvents (D).

Example 2

The Influence of the TMAH Concentration of the Test Solutions (SB) on the Etching Rate Additionally, the compatibility of the test solutions (SB) containing the polar organic solvents of Table 1 and 1% by weight, 2% by weight and 4% by weight of TMAH, the weight percentages being based on the complete weight of the respective test solution, was tested as follows.

Pieces of silicon semiconductor wafers were coated with 400 nm thick ultra low-k layers consisting of carbon-doped silicon oxide (Black Diamond™ produced by Applied Materials, Inc.).

In order to evaluate the influence of the test solutions (SB) on the ultra low-k layers, an untreated ultra low-k layer was annealed at 150° C. for 120 minutes as the reference point. If at all, the annealing caused only very minimal changes of the thickness and of the refractive index.

The pieces of silicon semiconductor wafer coated with ultra low-k layers were then exposed to the stirred (100 rpm) test solutions (SB) in beakers at 50° C. for 180 seconds. Thereafter, the pieces were taken from the test solutions (SB), rinsed with isopropanol and water and then dried in a stream of dry nitrogen at 50° C. After cooling down to room temperature, the changes of the thickness of the ultra low-k layers and of the refractive index were measured:

Contrary to the untreated ultra low-k layer, almost all the exposed ultra low-k layers exhibited a significant decrease in thickness, in particular those layers which had been exposed to test solutions (SB) containing 2% by weight and 4% by weight of TMAH. After the test solutions (SB) were removed from the exposed ultra low-k layers by annealing them at 150° C. for 120 minutes, the thickness decreased even further, in particular, in the case of the layers which had been exposed to test solutions (SB) containing 2% by weight and 4% by weight of TMAH.

Contrary to the untreated ultra low-k layers, almost all the exposed ultra low-k layers exhibited a significant increase of their refractive index, in particular those layers which had been exposed to test solutions (SB) containing 2% by weight and 4% by weight of TMAH. After the test solutions (SB) were removed from the exposed ultra low-k layers by annealing them at 150° C. for 120 minutes, the refractive index increased even further, in particular, in the case of the layers which had been exposed to test solutions (SB) containing 2% by weight and 4% by weight of TMAH.

These results demonstrated that high concentrations of TMAH led to a significant damage of the ultra low-k material, due to the high etching rate of the respective test solutions (SB).

No disadvantageous effects of this kind were observed, when the ultra low-k layers had been exposed to test solutions (SB) containing <0.5% by weight TMAH. In these cases, the etching rates were below 1 nm/minute.

The experiments were repeated with ultra low-k layers which had been exposed to a fluorine containing etching plasma customarily used for the selective etching in order to produce the wire trenches and via holes. It turned out that the plasma damaged ultra low-k layers were even more resistant to the test solutions (SB) containing <0.5% by weight TMAH than the undamaged ultra low-k layer.

The experiments were repeated with pieces of copper disks. It turned out that the test solutions (SB) containing <0.5% by weight TMAH exhibited an etching rate below 1 nm/minute, whereas the test solutions (SB) containing more 1% by weight, 2% by weight and 4% by weight of TMAH exhibited much higher etching rates.

Similar results were obtained with tetrapropylammonium hydroxide, tetrabutylammonium hydroxide and benzyltrimethyl ammonium hydroxide. The reactivity of these quaternary ammonium hydroxides is lower than TMAH and decreases in this order. This opens up the possibility of fine-tuning the compositions and to adapt them to special manufacturing conditions in a simple manner.

To summarize, these findings further underline that compositions containing the polar organic solvents (A) selected in accordance with the Example 1 and quaternary ammonium hydroxides, in particular TMAH, in low concentrations are most particularly well suited and can be most advantageously used as resists stripping compositions for the removal of patterned photoresists, polymeric barrier anti-reflective layers and post-etch residues in the back-and-of the line (BEOL) copper damascene process for the manufacture of ICs with VLI and VLSI without damaging the ultra-low-k materials or etching the copper surfaces.

Example 3

The Use of Compositions Containing the Polar Organic Solvents (A) and TMAH in Low Concentrations as Resists Stripping Compositions 300 mm silicon semiconductor wafers coated, in this order, with a 30 nm thick silicon carbide etch stop layer, a 386 nm thick ultra low-k carbon-doped silicon oxide layer, a 39 nm thick titanium nitride hard mask layer, a 28 nm thick polymeric barrier anti-reflective layer containing deep UV absorbing groups and a 60 nm thick layer of a positive 194 nm deep UV resist on the basis of a methacrylate copolymer containing pending adamantane and lactone groups were used for the Example 3.

The coated silicon semiconductor wafers were selectively irradiated with 194 nm deep UV radiation through test masks having various apertures with dimensions below 100 nm, thereby solubilizing the exposed areas of the negative resist. Thereafter, the masks were removed and the irradiated resists layers were developed with an aqueous sodium hydroxide solution to yield the desired resist patterns.

The upper surface of the coated silicon semiconductor wafers were then exposed to a fluorine containing etching plasma using the patterned resists as the masks, thereby removing the areas of the polymeric barrier anti-reflective layers of the titanium nitride hard mask layers not protected by the resist patterns. In this process step, the ultra-low-k layers were not etched through but, at the most, only down to a small depth as compared with the complete thickness of the ultra low-k layers.

Resist stripping compositions were prepared by mixing the ingredients in the desired amounts and homogenizing the resulting mixtures. The ingredients and their amounts are compiled in the Table 3. The percentages are given in percent by weight, based on the complete weight of the respective resists stripping composition.

TABLE 3

The Ingredients of the Resists Stripping Compositions and Their Amounts

| Example No. | (A) Solvent Amount/% | (B) TMAH Amount/% | (C) Water Amount/% | (E) Benzotriazole Amount/% |
|---|---|---|---|---|
| 3.1 | S1 98.7 | 0.06 | 0.24 | 1 |
| 3.2 | S2 98.7 | 0.06 | 0.24 | 1 |
| 3.3 | S3 98.7 | 0.06 | 0.24 | 1 |
| 3.4 | S4 98.7 | 0.06 | 0.24 | 1 |
| 3.5 | S5 98.7 | 0.06 | 0.24 | 1 |

The resists stripping compositions 3.1 to 3.5 of Table 3 had a dynamic viscosity at 50° C. as measured by rotational viscometry in the range of from 2 to 5 mPas. They were used to remove the patterned resists, the patterned barrier anti-reflective layers and post-etch residues from the etched coated silicon semiconductor wafers. To this end, the wafers were placed into beakers and exposed to the stirred (100 rpm) resist stripping compositions at 50° C. for 300 s. Thereafter, the wafers were taken from the resist stripping compositions, rinsed with isopropanol and then with water and dried with a stream of dry nitrogen at 50° C. After cooling down to room temperature, the structures of the hard masks were inspected for defects with AFM (atomic force microscopy) and SEM (scanning electron microscopy).

In all cases, the step heights of the patterned hard masks equalled exactly their original thickness, demonstrating that the resist stripping compositions had completely removed the patterned resists, the patterned barrier anti-reflective layers and post-etch residues without attacking the ultra low-k layers. The patterned hard masks reproduced exactly the structure of the test masks. No defects, deformations, irregular sidewalls, residues or redeposited materials could be observed which even more so underlined that the resist stripping compositions exhibited an excellent cleaning power combined with an excellent compatibility.

Example 4

The Use of Compositions Containing the Polar Organic Solvents (A) and TMAH in Low Concentrations for Stripping Positive-Tone and Negative-Tone Photoresists and Post-Etch Residues and the Compatibility of the Compositions with Glue Materials Bonding Thinned Silicon Wafers on Carriers The compositions 3.1 to 3.5 of the Example 3 were used for carrying out the Exampled 4.

Blanket silicon wafer pieces coated with commercially available positive-tone resist or negative-tone resist layers having a thickness of 3.5 μm, 7 μm and 5 μm, respectively were exposed to the compositions 3.1 to 3.5 at 65° C. for 5 minutes in beakers. They were subsequently rinsed with de-ionized water for 3 minutes and dried using a nitrogen gun.

The compatibility with glue materials was checked in the same way.

It could be confirmed by optical inspection and FTIR spectroscopy that the resists were completely removed from the blanket silicon wafers. On the other hand, the glue materials were not attacked by the compositions 3.1 to 3.5.

The removal of positive-tone photoresists, negative-tone photoresist and post-etch residues from patterned silicon wafer pieces having copper micro-bumps, copper plating and TSV was tested in the same way. It could be confirmed by X-SEM that the compositions 3.1 to 3.5 were capable of completely removing the photoresists and residues without damaging the fine structures.

I claim:
1. A liquid composition, comprising:
(A) from 40 to 99.95% by weight of at least one polar organic solvent selected from the group consisting of diethylenetriamine, N-methyl imidazole, 3-amino-1-propanol, 5-amino-1-pentanol, and dimethyl sulfoxide;
(B) from 0.05 to less than 0.5% by weight of at least one quaternary ammonium hydroxide;
(C) from 0.24% to less than 5% by weight of water; and
(D) a polar organic solvent selected from the group consisting of ethanolamine, N-methylethanolamine, N-ethylethanolamine, isopropanolamine, 2-(2-aminoethylamino)ethanol, 2-(2-aminoethoxyl)ethanol, diethylene glycol monoethyl ether when dimethyl sulfoxide is absent from component (A), diethylene glycol monobutyl ether when dimethyl sulfoxide is absent from component (A), N-(2-hydroxyethyl)piperidine, 1,3-dimethyl-3,4,5,6-tetrahydro-2-(1H)-pyrimidinone, and N-(3-aminopropyl)imidazole,
wherein
all weight percentages are based on the complete weight of the composition,
the composition is free from N-alkylpyrrolidones, hydroxyl amines, and hydroxyl amine derivatives,
the composition has a dynamic shear viscosity at 50° C. of from 1 to 10 mPas as measured by rotational viscometry,
the liquid composition is a homogeneous liquid composition,
dimethyl sulfoxide, when present, is present in component (A) in at least the minimum amount of 40% by weight, and
when dimethyl sulfoxide is present in component (A), components (A), (B), (C), and (D) are molecularly dispersed in the liquid composition in the absence of alkylene glycol monoalkyl ether and a further glycol-comprising surfactant.
2. The liquid composition of claim 1, wherein the dynamic shear viscosity at 50° C. is from 1.5 to 7 mPas.
3. The liquid composition of claim 1, wherein the quaternary ammonium hydroxide (B) is selected from the group consisting of tetramethylammonium, tetraethylammonium, tetrapropylammonium, tetrabutylammonium, benzyltrimethylammonium, and (2-hydroxyethyl)ammonium hydroxide.

4. The liquid composition of claim 3, wherein the quaternary ammonium hydroxide (B) is tetramethylammonium hydroxide.

5. The liquid composition of claim 1, wherein the composition comprises at least one additional component selected from the group consisting of a corrosion inhibitor (E), a chelating agent (F), a fluoride salt (G), and a surfactant (H) other than alkylene glycol monoalkyl ether and a further glycol-comprising surfactant when dimethyl sulfoxide is present in component (A).

6. The liquid composition of claim 5, wherein the corrosion inhibitor (E) is at least one copper corrosion inhibitor.

7. The liquid composition of claim 1, which does not comprise a water-soluble polymer.

8. The liquid composition of claim 1, wherein component (A) is present in an amount of from 50 to 99.95% by weight.

9. The liquid composition of claim 1, wherein component (C) from 0.24% to less than 3% by weight of water.

10. The liquid composition of claim 1, wherein component (C) from 0.24% to less than 2% by weight of water.

11. The liquid composition of claim 1, which does not comprise dimethyl sulfoxide.

12. The liquid composition of claim 1, which is compatibility of the composition of the invention with the glue material bonding thinned wafers on carriers.

13. The liquid composition of claim 1, wherein dimethyl sulfoxide is present in component (A) and is present in at least the minimum amount of 40% by weight.

14. A method for preparing the liquid composition of claim 1, the method comprising:
  (I) selecting at least one polar organic solvent (A) selected from the group consisting of diethylenetriamine, N-methyl imidazole, 3-amino-1-propanol, 5-amino-1-pentanol, and dimethyl sulfoxide;
  (II) selecting at least one of the polar organic solvent (D), which is different from the polar organic solvent (A) selected in (I), selected from the group consisting of ethanolamine, N-methylethanolamine, N-ethylethanolamine, isopropanolamine, 2-(2-aminoethylamino)ethanol, 2-(2-aminoethoxyl)ethanol, diethylene glycol monoethyl ether when dimethyl sulfoxide is absent from component (A), diethylene glycol monobutyl ether when dimethyl sulfoxide is absent from component (A), N-(2-hydroxyethyl)piperidine, 1,3-dimethyl-3,4,5,6-tetrahydro-2-(1H)-pyrimidinone, and N-(3-aminopropyl)imidazole;
  (III) mixing, based on the complete weight of the resulting mixture:
    (a) from 40 to 99.95% by weight of the at least one of the polar organic solvent (A) selected in (I) and the at least one polar organic solvent (D) selected in (II);
    (b) from 0.05 to less than 0.5% by weight of the at least one of the quaternary ammonium hydroxide (B);
    (c) from 0.24% to less than 5% by weight of the water; and
    (d) at least one of the polar organic solvent (A) selected in (I) and at least one of the polar organic solvent (D) selected in (II),
    in the absence of N-alklpyrrolidones, hydroxyl amines, and hydroxyl amine derivatives; and
  (IV) adjusting the dynamic shear viscosity at 50° C. of the mixture resulting from the mixing
  (III) to 1 to 10 mPas, as measured by rotational viscometry, wherein the mixture is a liquid composition that is a homogeneous liquid composition, dimethyl sulfoxide, when present, is present in component (A) in at least the minimum amount of 40% by weight, and when dimethyl sulfoxide is present in component (A), components (A), (B), (C), and (D) are molecularly dispersed in the liquid composition in the absence of alkylene glycol monoalkyl ether and a further glycol-comprising surfactant.

15. The method of claim 14, wherein dimethyl sulfoxide is present in component (A) and is present in at least the minimum amount of 40% by weight.

16. A method for manufacturing an electrical device, the method comprising:
  (1) applying an insulating dielectric layer, consisting of at least one low-k or ultra-low-k material, on top of a substrate;
  (2) applying a positive or a negative resist layer on top of the insulating dielectric layer (1);
  (3) selectively exposing the resist layer (2) to electromagnetic radiation or corpuscular radiation;
  (4) developing the selectively exposed resist layer (3) to form a resist pattern;
  (5) dry-etching the insulating dielectric layer (1) using the resist pattern (4) as a mask to form wire trenches, via holes, or both, communicating with a substrate surface;
  (6) selecting at least one of the polar organic solvent (A) from the group consisting of diethylenetriamine, N-methyl imidazole, 3-amino-1-propanol, 5-amino-1-pentanol, and dimethyl sulfoxide, which exhibits in the presence of from 0.06 to 4% by weight of dissolved tetramethylammonium hydroxide (B), the weight percentage being based on the complete weight of the respective test solution, a constant removal rate at 50° C. for a 30 nm thick polymeric barrier anti-reflective layer comprising at least one deep UV absorbing chromophoric group;
  (7) removing the resist pattern (4) and post-etch residues with at least one resist stripping composition by an all-wet process; and
  (8) filling the wire trenches (5), via holes (5), or both, with at least one material having a low electrical resistivity,
  wherein the at least one resist stripping composition (7) is free from N-alkylpyrrolidones, hydroxyl amines, and hydroxyl amine derivatives, has a dynamic shear viscosity at 50° C. of from 1 to 10 mPas as measured by rotational viscometry, and comprises
    (A) from 40 to 99.95% of at least one of the polar organic solvent (A) selected in (6),
    (B) from 0.05 to less than 0.5% by weight of at least one quaternary ammonium hydroxide (B),
    (C) from 0.24% to less than 5% by weight of water, and
    (D) a polar organic solvent selected from the group consisting of ethanolamine, N-methylethanolamine, N-ethylethanolamine, isopropanolamine, 2-(2-aminoethylamino)ethanol, 2-(2-aminoethoxyl)ethanol, N-(2-hydroxyethyl)piperidine, 1,3-dimethyl-3,4,5,6-tetrahydro-2-(1H)-pyrimidinone, diethylene glycol monoethyl ether when dimethyl sulfoxide is absent from component (A), diethylene glycol monobutyl ether when dimethyl sulfoxide is absent from component (A), and N-(3-aminopropyl)imidazole,
    the weight percentages of (A), (B), and (C) based on the complete weight of the composition,
  wherein the liquid composition is a homogeneous liquid composition, dimethyl sulfoxide, when present, is present in component (A) in at least the minimum amount of 40% by weight, and when dimethyl sulfoxide is present in component (A), components (A), (B), (C), and (D) are molecularly dispersed in the liquid composition in the absence of alkylene glycol monoalkyl ether and a further glycol-comprising surfactant.

17. The method of claim 16, wherein the at least one quaternary ammonium hydroxide (B) is selected from the group consisting of tetramethylammonium, tetraethylammonium, tetrapropylammonium, tetrabutylammonium, benzyltrimethylammonium, and (2-hydroxyethyl)ammonium hydroxide.

18. The method of claim 16, wherein the quaternary ammonium hydroxide (B) is tetramethylammonium hydroxide.

19. The method of claim 16, wherein the resist stripping composition (7) further comprises:
a corrosion inhibitor (E), a chelating agent (F), a fluoride salt (G), and a surfactant (H) other than alkylene glycol monoalkyl ether and a further glycol-comprising surfactant when dimethyl sulfoxide is present in component (A).

20. The method claim 19, wherein the corrosion inhibitor (E) is at least one copper corrosion inhibitor.

21. The method of claim 16, further comprising:
(9) interposing a hard mask layer between the resist layer (2) and the insulating dielectric layer (1),
wherein the hard mask layer (9) is selectively etched using the resist pattern (4) as the mask in the dry-etching (5).

22. The method of claim 21, further comprising:
(10) interposing a barrier anti-reflective layer between the hard mask layer (9) and the resist layer (2),
wherein the barrier anti-reflective layer (10) and the hard mask layer (9) are selectively etched in the dry-etching (5).

23. The method of claim 16, further comprising:
(10) interposing a barrier anti-reflective between the resist layer (2) and the insulating dielectric layer (1),
wherein the barrier anti-reflective layer (10) is selectively etched using the resist pattern (4) as the mask in dry-etching (5).

24. The method of claim 23, wherein the selectively etched barrier anti-reflective layer (10) is removed during removal (7).

25. The method of claim 16, wherein the resist stripping composition (7) is the liquid composition of claim 1.

26. The method of claim 16, wherein the material having a low electrical resistivity (8) comprises copper.

27. The method of claim 16, wherein the manufactured electrical device is selected from the group consisting of a semiconductor integrated circuit, a liquid crystal panel, an organic electroluminescent panel, a printed circuit board, a micro machine, a DNA chip and a micro plant.

28. The method of claim 16, wherein dimethyl sulfoxide is present in component (A) and is present in at least the minimum amount of 40% by weight.

29. A method of manufacture, comprising removing negative-tone and positive-tone photoresists and post-etch residues by way of patterning Through Silicon Vias, plating and bumping, or both, with a liquid composition,
wherein
the liquid composition is free from N-alkylpyrrolidones, hydroxyl amines, and hydroxyl amine derivatives,
the liquid composition has a dynamic shear viscosity at 50° C. of from 1 to 10 mPas as measured by rotational viscometry, and
the liquid composition comprises, based on the complete weight of the composition:
(A) from 40 to 99.95% by weight of at least one polar organic solvent selected from the group consisting of diethylenetriamine, N-methyl imidazole, 3-amino-1-propanol, 5-amino-1-pentanol, and dimethyl sulfoxide, which exhibits, in the presence of from 0.06 to 4% by weight of dissolved tetramethylammonium hydroxide (B), the weight percentage being based on the complete weight of a respective test solution (AB), a constant removal rate at 50° C. for a 30 nm thick polymeric barrier anti-reflective layer comprising deep UV absorbing chromophoric groups;
(B) from 0.05 to less than 0.5% by weight of at least one quaternary ammonium hydroxide;
(C) from 0.24% to less than 5% by weight of water, and (D) a polar organic solvent selected from the group consisting of ethanolamine, N-methylethanolamine, N-ethylethanolamine, isopropanolamine, 2-(2-aminoethylamino)ethanol, 2-(2-aminoethoxyl)ethanol, N-(2-hydroxyethyl)piperidine, 1,3-dimethyl-3,4,5,6-tetrahydro-2-(1H)-pyrimidinone, diethylene glycol monoethyl ether when dimethyl sulfoxide is absent from component (A), diethylene glycol monobutyl ether when dimethyl sulfoxide is absent from component (A), and N-(3-aminopropyl)imidazole,
wherein
the liquid composition is a homogeneous liquid composition,
dimethyl sulfoxide, when present, is present in component (A) in at least the minimum amount of 40% by weight, and
when dimethyl sulfoxide is present in component (A), components (A), (B), (C), and (D) are molecularly dispersed in the liquid composition in the absence of alkylene glycol monoalkyl ether and a further glycol-comprising surfactant.

30. The method of claim 29, wherein dimethyl sulfoxide is present in component (A) and is present in at least the minimum amount of 40% by weight.

* * * * *